(12) United States Patent
Sadiq et al.

(10) Patent No.: US 10,560,910 B2
(45) Date of Patent: Feb. 11, 2020

(54) SYNCHRONIZATION SIGNAL FOR A BROADCAST CHANNEL

(71) Applicant: QUALCOMM Incorporated, San Diego, CA (US)

(72) Inventors: Bilal Sadiq, Basking Ridge, NJ (US); Juergen Cezanne, Ocean Township, NJ (US); Shrinivas Kudekar, Raritan, NJ (US); Navid Abedini, Raritan, NJ (US); Muhammad Nazmul Islam, Edison, NJ (US)

(73) Assignee: QUALCOMM Incoporated, San Diego, CA (US)

( * ) Notice: Subject to any disclaimer, the term of this patent is extended or adjusted under 35 U.S.C. 154(b) by 0 days.

(21) Appl. No.: 15/926,884

(22) Filed: Mar. 20, 2018

(65) Prior Publication Data

US 2018/0359714 A1 Dec. 13, 2018

Related U.S. Application Data

(60) Provisional application No. 62/518,589, filed on Jun. 12, 2017.

(51) Int. Cl.
*H04W 56/00* (2009.01)
*H04W 72/00* (2009.01)
(Continued)

(52) U.S. Cl.
CPC ......... *H04W 56/001* (2013.01); *H04L 1/0011* (2013.01); *H04L 5/0044* (2013.01); *H04W 72/005* (2013.01)

(58) Field of Classification Search
None
See application file for complete search history.

(56) References Cited

U.S. PATENT DOCUMENTS 10,312,939 B2 6/2019 Richardson et al.
2002/0181594 A1 12/2002 Katsavounidis et al.
(Continued)

OTHER PUBLICATIONS

Ericsson: "CR 25.212-049: Editorial Changes to Annex A," 3GPP Draft, R1-00-0243 CR25212-049 Annex, 3rd Generation Partnership Project (3GPP), Mobile Competence Centre, 650, Route Des Lucioles, F-06921 Sophia-Antipolis Cedex, France, vol. RAN WG1, No, San Diego, USA, Feb. 22, 2000, Feb. 22, 2000 (Feb. 22, 2000), XP050091935, 5 Pages, [retrieved on Feb. 22, 2000].

(Continued)

*Primary Examiner* — Candal Elpenord
(74) *Attorney, Agent, or Firm* — Arent Fox, LLP

(57) ABSTRACT

An apparatus is provided for wireless communication at a base station with improved PBCH construction and decoding. The base station apparatus constructs a PBCH payload, wherein a bit location is selected for encoding a plurality of bits of the PBCH based on an estimated reliability for the corresponding bits location wherein the plurality of bits comprises frozen bits, unknown bits that are unknown to a user equipment, and potentially known bits that are potentially known by the user equipment. The apparatus transmits the PBCH payload in at least one of a plurality of SS blocks. A UE receiving the PBCH decodes the PBCH based on a successive decoding order. The successive decoding order may be based on an estimated reliability for the corresponding bits, e.g., in which potentially known bits are decoded prior to unknown bits.

32 Claims, 14 Drawing Sheets

(51) Int. Cl.
　　　*H04L 5/00*　　　(2006.01)
　　　*H04L 1/00*　　　(2006.01)

(56) References Cited

U.S. PATENT DOCUMENTS

| | | | |
|---|---|---|---|
| 2011/0105107 A1* | 5/2011 | Kwon | H04W 28/06 |
| | | | 455/422.1 |
| 2016/0182187 A1 | 6/2016 | Kim et al. | |
| 2016/0269050 A1 | 9/2016 | Shen et al. | |
| 2017/0222754 A1 | 8/2017 | Noh et al. | |
| 2018/0019766 A1 | 1/2018 | Yang et al. | |
| 2018/0035427 A1 | 2/2018 | Gupta et al. | |
| 2018/0048349 A1 | 2/2018 | Sun et al. | |
| 2018/0192403 A1 | 7/2018 | Shelby et al. | |
| 2018/0198469 A1 | 7/2018 | Sarkis et al. | |
| 2018/0198555 A1* | 7/2018 | Wu | H04L 1/0009 |
| 2018/0198560 A1 | 7/2018 | Jiang et al. | |
| 2018/0198561 A1 | 7/2018 | Tsai et al. | |
| 2018/0199350 A1 | 7/2018 | John et al. | |
| 2018/0279243 A1 | 9/2018 | Sadiq et al. | |
| 2018/0294922 A1 | 10/2018 | Li et al. | |
| 2018/0323803 A1* | 11/2018 | Palgy | H03M 13/618 |
| 2018/0323804 A1 | 11/2018 | Sadiq et al. | |
| 2018/0324022 A1* | 11/2018 | Sheng | H04L 5/0094 |

OTHER PUBLICATIONS

Huawei et al., "Channel Coding for PBCH," 3GPP Draft, R1-1704249, 3rd Generation Partnership Project (3GPP), Mobile Competence Centre, 650, Route Des Lucioles, F-06921 Sophia-Antipolis Cedex, France, vol. RAN WG1, No, Spokane USA, Apr. 3, 2017-Apr. 7, 2017, Apr. 2, 2017 (Apr. 2, 2017), XP051242401, 6 Pages, Retrieved from the Internet: URL:http://www.3gpp.org/ftp/Meetings_3GPP_SYNC/RAN1/Docs/ [retrieved on Apr. 2, 2017].

Huawei., et al., "Polar Code Construction for NR," 3GPP Draft; R1-1608862, 3GPP TSG RAN WG1 Meeting #86bis, Lisbon, Portugal, Oct. 9, 2016 (Oct. 9, 2016), 8 pages, Retrieved from the Internet: URL: http://www.3gpp.org/ftp/Meetings_3GPP_SYNC/RAN1/Docs/.

International Search Report and Written Opinion—PCT/US2018/029910—ISA/EPO—dated Aug. 9, 2018.

Mediatek Inc: "PBCH Enhancement with Polar Code", 3GPP Draft; R1-1700169_PBCH Enhancement with Polar Code Final, 3rd Generation Partnership Project (3GPP), Mobile Competence Centre, 650, Route Des Lucioles, F-06921, Sophia-Antipolis Cedex, France, vol. RAN WGl, No. Spokane, USA; Jan. 16, 2017-Jan. 20, 2017, Jan. 16, 2017 (Jan. 16, 2017), 5 Pages, XP051207711, Retrieved from the Internet: URL: http://www.3gpp.org/ftp/Meetings_3GPP_Sync/RAN1/Docs/ [retrieved on Jan. 16, 2017].

Qualcomm Incorporated: "PBCH Channel Coding", 3GPP Draft; R1-1700837 PBCH Channel Coding, 3rd Generation-Partnership Project (3GPP), Mobile Competence Centre; 650, Route Des Lucioles; F-06921 Sophia-Antipolis Cedex; France, vol. RAN WG1, No. Spokane, WA; Jan. 16, 2017-Jan. 20, 2017, Jan. 16, 2017 (Jan. 16, 2017), pp. 1-3, XP051208356, Retrieved from the Internet: URL: http://www.3gpp.org/ftp/Meetings_3GPP_SYNC/RAN1/Docs/ [retrieved on Jan. 16, 2017].

"3GPP TS 38.212; 3rd Generation Partnership Project; Technical Specification Group Radio Access Network; NR; Multiplexing and channel coding (Release 15)", V15.4.0, Dec. 2018, 97 pages.

* cited by examiner

SYNCHRONIZATION SIGNAL FOR A BROADCAST CHANNEL

CROSS-REFERENCE TO RELATED APPLICATION

This application claims the benefit of U.S. Provisional Application Ser. No. 62/518,589, entitled "Synchronization Signal for a Physical Broadcast Channel" and filed on Jun. 12, 2017, which is expressly incorporated by reference herein in its entirety.

BACKGROUND

Field

The present disclosure relates generally to communication systems, and more particularly, to synchronization signals and broadcast channels.

Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

In NR, multiple burst-sets, e.g., beam sweeps of L Synchronization Signal (SS) blocks, may be transmitted by a base station within a broadcast channel (BCH) transmission time interval (TTI). A burst-set may be a set of SS blocks comprising one complete beam sweep.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

A physical broadcast channel (PBCH) payload may include encoded bits that are already known to a User Equipment (UE), such as frozen bits. The PBCH payload may include encoded bits that are potentially known to the UE, and the UE may need to decode the PBCH for only a remaining set of unknown information. Aspects presented herein improve PBCH construction at the base station and PBCH decoding performance by a UE. A base station may construct the PBCH by selecting a bit location for information based on whether the information comprises frozen bits, potentially known information, and unknown information. For example, the base station may give at least some of the potentially known bits a less reliable bit location than the unknown bits and may give the frozen bits a less reliable bit location than the potentially known bits. A UE may decode the PBCH using a successive decoding order in which potentially known bits are decoded first and at least part of the unknown bits are decoded subsequently.

In an aspect of the disclosure, a method, a computer-readable medium, and an apparatus are provided for wireless communication at a base station. The apparatus constructs a PBCH payload, wherein a bit location is selected for encoding a plurality of bits of the PBCH based on an estimated reliability for the corresponding bits location wherein the plurality of bits comprises frozen bits, unknown bits that are unknown to a user equipment, and potentially known bits that are potentially known by the user equipment. The apparatus transmits the PBCH payload in at least one of a plurality of SS blocks.

In another aspect of the disclosure, a method, a computer-readable medium, and an apparatus are provided for wireless communication at a UE served by a first base station. The apparatus receives a PBCH payload of a second cell in at least one of a plurality of SS blocks, wherein each SS block comprises corresponding timing information, and wherein the PBCH payload comprises frozen bits, unknown bits that are unknown to the user equipment, and potentially known bits that are potentially known by the user equipment. The potentially known bits may comprise system information provided to the UE by the first cell. The apparatus decodes the PBCH based on a successive decoding order. The successive decoding order may be based on an estimated reliability for the corresponding bits, e.g., in which potentially known bits are decoded prior to unknown bits.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
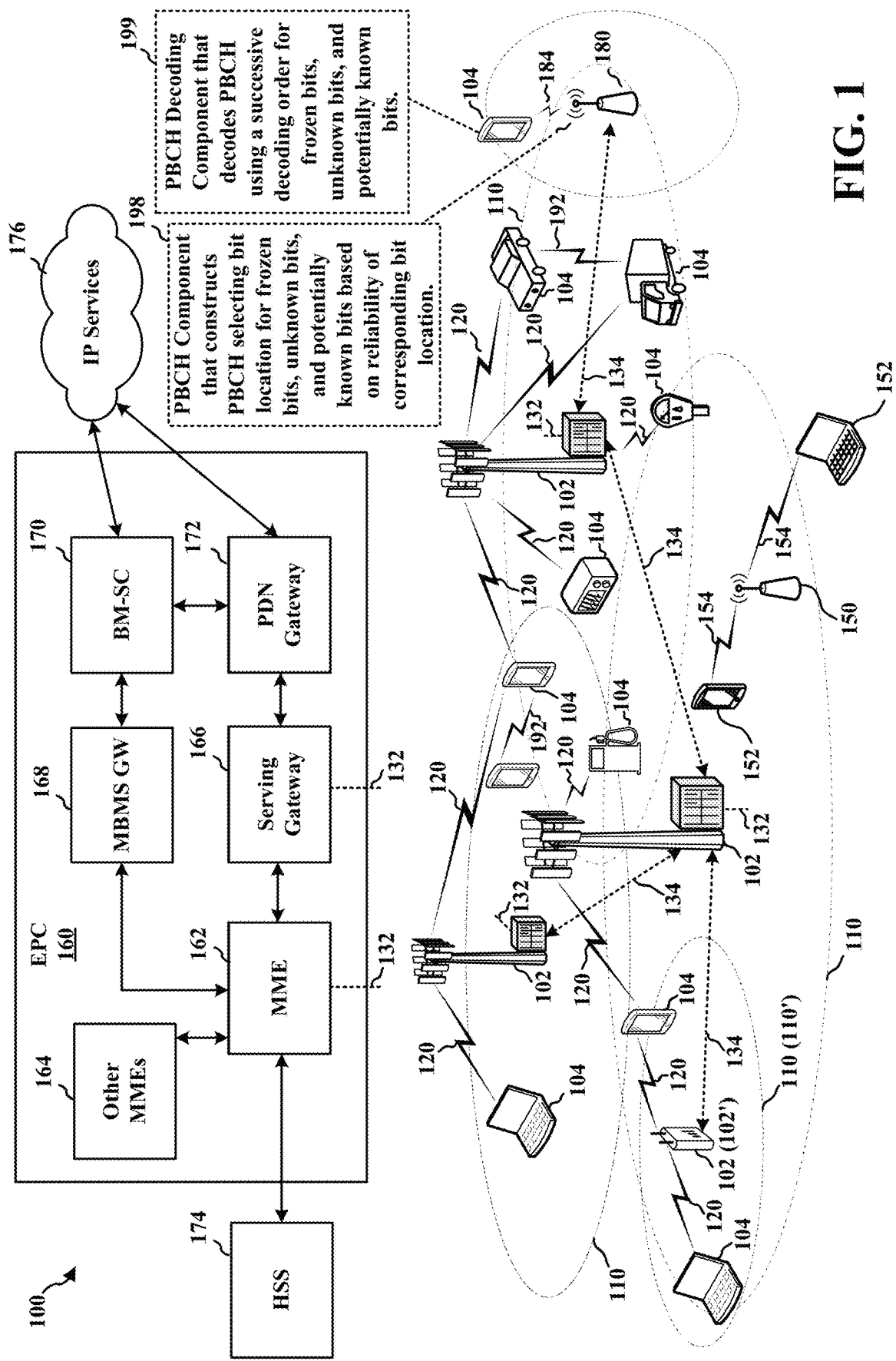
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include base stations. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 192. The D2D communication link 192 may use the DL/UL WWAN spectrum. The D2D communication link 192 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The gNodeB (gNB) 180 may operate in millimeter wave (mmW) frequencies and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 104 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a toaster, or any other similar functioning device. Some of the UEs 104 may be referred to as IoT devices (e.g., parking meter, gas pump, toaster, vehicles, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the base station 180 may be configured to include a PBCH component 198 that is configured to construct a PBCH payload, wherein a bit location is selected for encoding a plurality of bits of the PBCH based on an estimated reliability for the corresponding bits location wherein the plurality of bits comprises frozen bits, unknown bits that are unknown to a user equipment, and potentially known bits that are potentially known by the user equipment. In other aspects, the UE 104 may be configured to include a PBCH decoding component 199 configured to decode a PBCH comprising frozen bits, unknown bits, and potentially known bits based on a successive decoding order.

Figure 2:
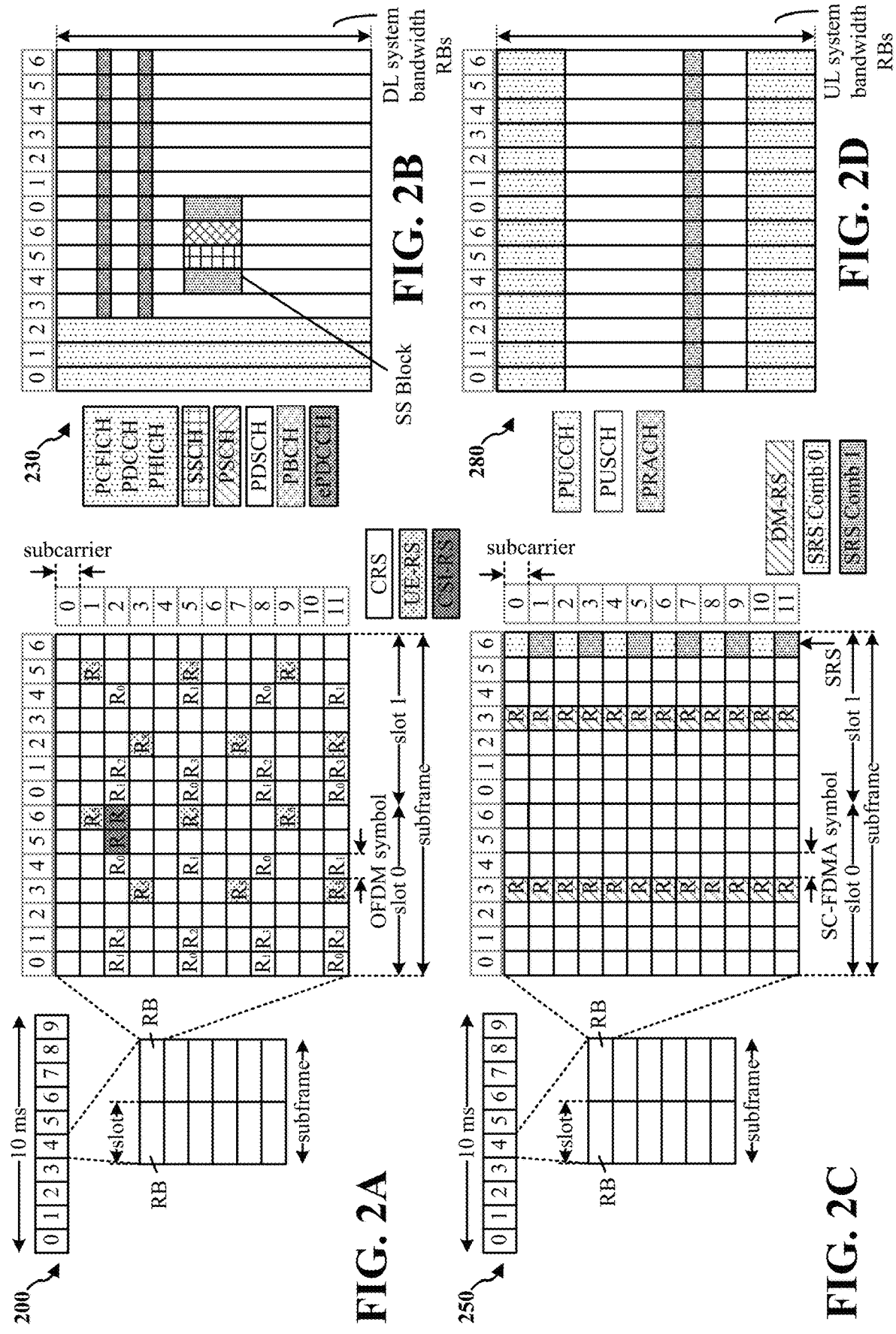
FIGS. 2A, 2B, 2C, and 2D are diagrams illustrating examples of a DL frame structure, DL channels within the DL frame structure, an UL frame structure, and UL channels within the UL frame structure, respectively.

FIG. 2A is a diagram 200 illustrating an example of a DL frame structure. FIG. 2B is a diagram 230 illustrating an example of channels within the DL frame structure. FIG. 2C is a diagram 250 illustrating an example of an UL frame structure. FIG. 2D is a diagram 280 illustrating an example of channels within the UL frame structure. Other wireless communication technologies may have a different frame structure and/or different channels. A frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). For a normal cyclic prefix, an RB may contain 12 consecutive subcarriers in the frequency domain and 7 consecutive symbols (for DL, OFDM symbols; for UL, SC-FDMA symbols) in the time domain, for a total of 84 REs. For an extended cyclic prefix, an RB may contain 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as $R_0$, $R_1$, $R_2$, and $R_3$, respectively), UE-RS for antenna port 5 (indicated as $R_5$), and CSI-RS for antenna port 15 (indicated as R).

FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (HACK) feedback based on the physical uplink shared channel (PUSCH). The primary synchronization channel (PSCH) may be within symbol 6 of slot 0 within subframes 0 and 5 of a frame. The PSCH carries a primary synchronization signal (PSS) that is used by a UE 104 to determine subframe/symbol timing and a physical layer identity. The secondary synchronization channel (SSCH) may be within symbol 5 of slot 0 within subframes 0 and 5 of a frame. The SSCH carries a secondary synchronization signal (SSS) that is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DL-RS. The physical broadcast channel (PBCH), which carries a master information block (MIB), may be logically grouped with the PSCH and SSCH to form a synchronization signal (SS) block. The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the base station. The UE may additionally transmit sounding reference signals (SRS) in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
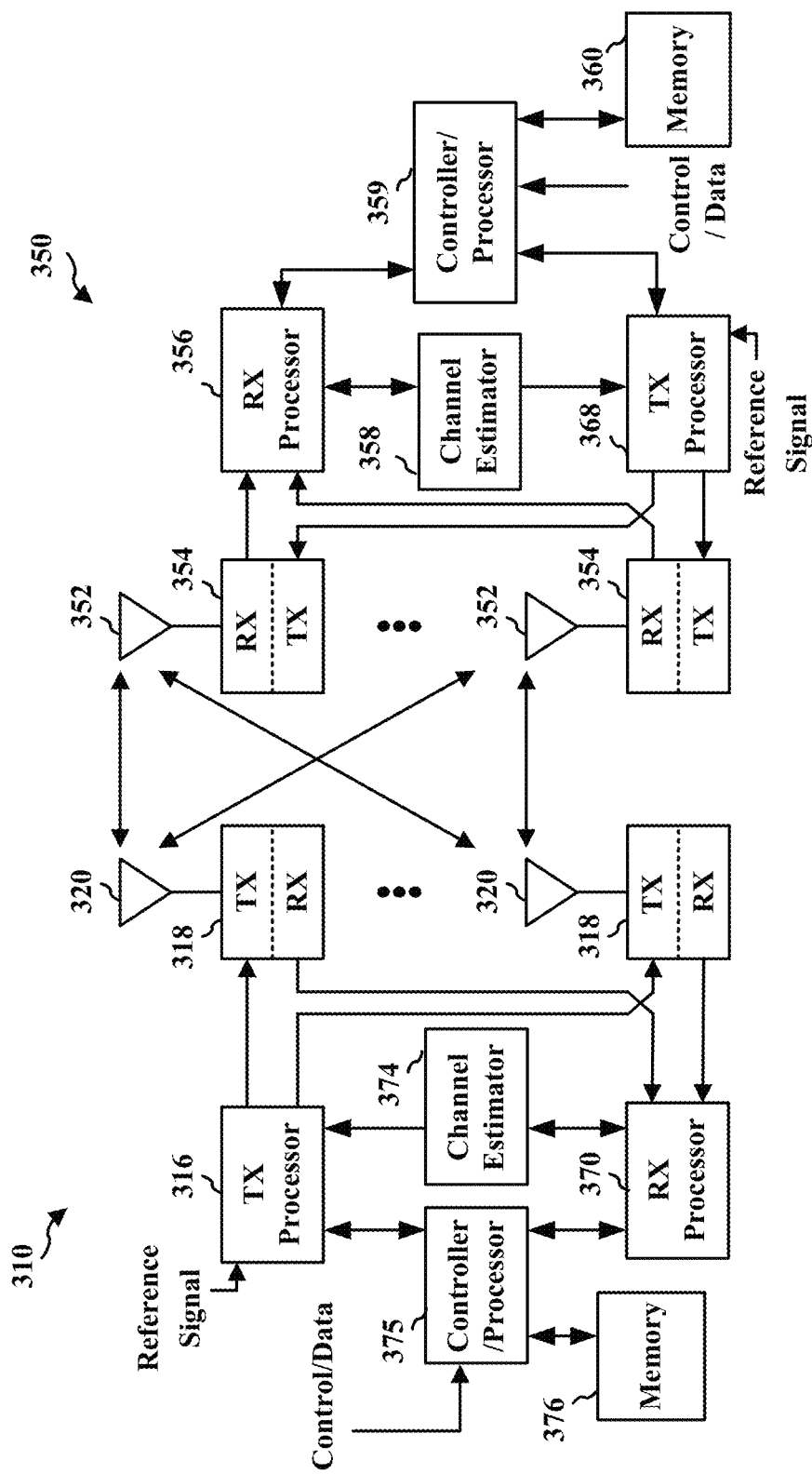
FIG. 3 is a diagram illustrating an example of a base station and UE in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

Figure 4:
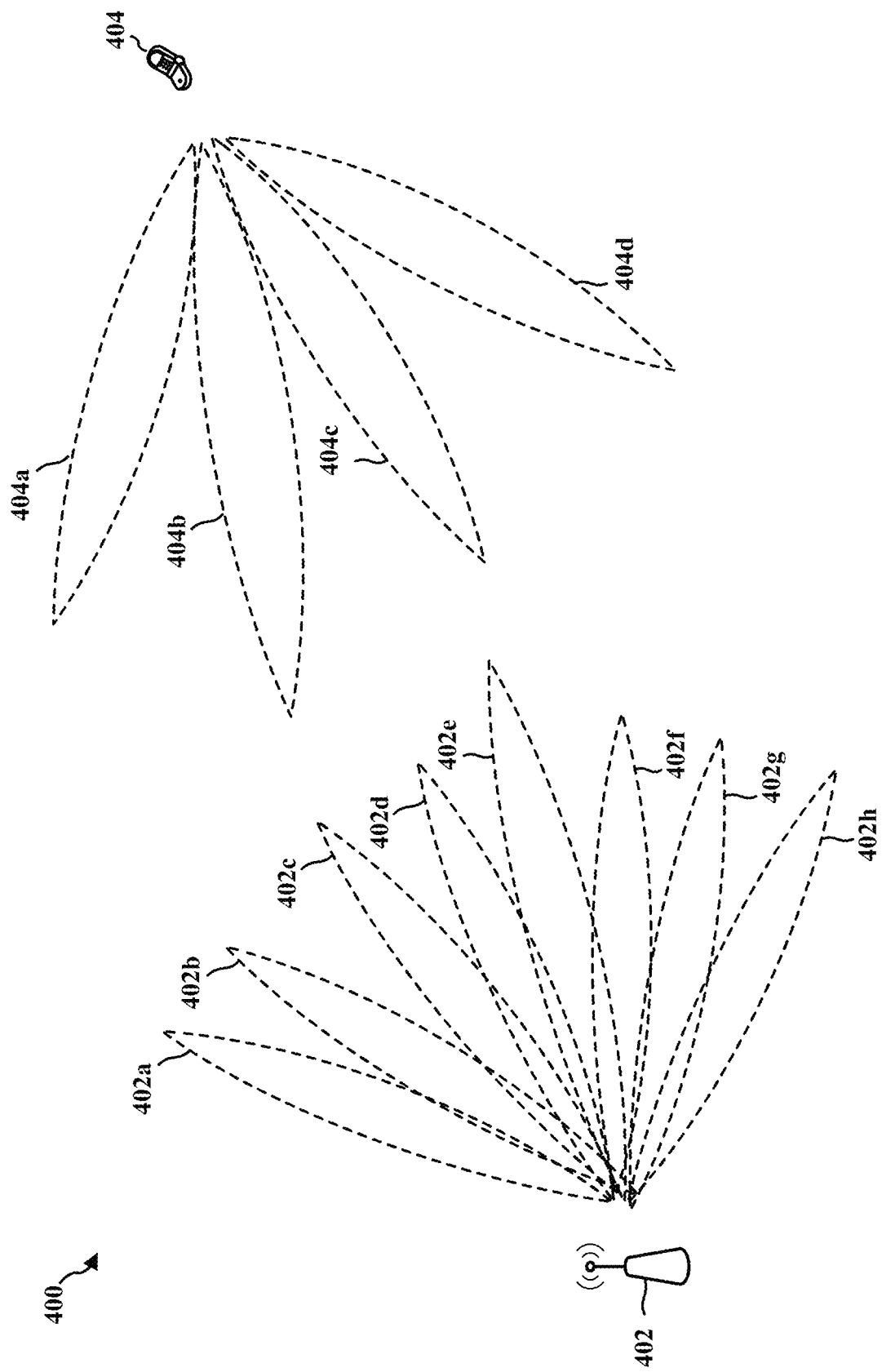
FIG. 4 is a diagram illustrating a base station in communication with a UE.

FIG. 4 is a diagram 400 illustrating a base station 402 in communication with a UE 404. Referring to FIG. 4, the base station 402 may transmit a beamformed signal to the UE 404 in one or more of the directions 402a, 402b, 402c, 402d, 402e, 402f, 402g, 402h. The UE 404 may receive the beamformed signal from the base station 402 in one or more receive directions 404a, 404b, 404c, 404d. The UE 404 may also transmit a beamformed signal to the base station 402 in one or more of the directions 404a-404d. The base station 402 may receive the beamformed signal from the UE 404 in one or more of the receive directions 402a-402h. The base station 402/UE 404 may perform beam training to determine the best receive and transmit directions for each of the base station 402/UE 404. The transmit and receive directions for the base station 402 may or may not be the same. The transmit and receive directions for the UE 404 may or may not be the same.

Synchronization signals (SS) may be beam-swept in multiple SS blocks, e.g., rather than being transmitted in a predetermined fixed locations. A Broadcast Channel (BCH) Transmission Time Interval (TTI) may comprise a time window over which System Information (SI) other than timing remains unchanged in a Physical Broadcast Channel (PBCH). Thus, within the BCH TTI, the PBCH payload other than timing information is the same for any transmitted PBCH. Residual timing information may be comprised within an SS block, e.g., in an SS block index.

For example, NR communication may include a BCH TTI of 80 ms. Within the BCH TTI, multiple SS burst-sets, e.g., beam sweeps of L SS blocks, may be transmitted. Initial cell selection burst-sets may repeat with a 20 ms period, for example. However, other periodicities may be possible for connected/idle UEs and for non-standalone deployment, etc.

Figure 5:
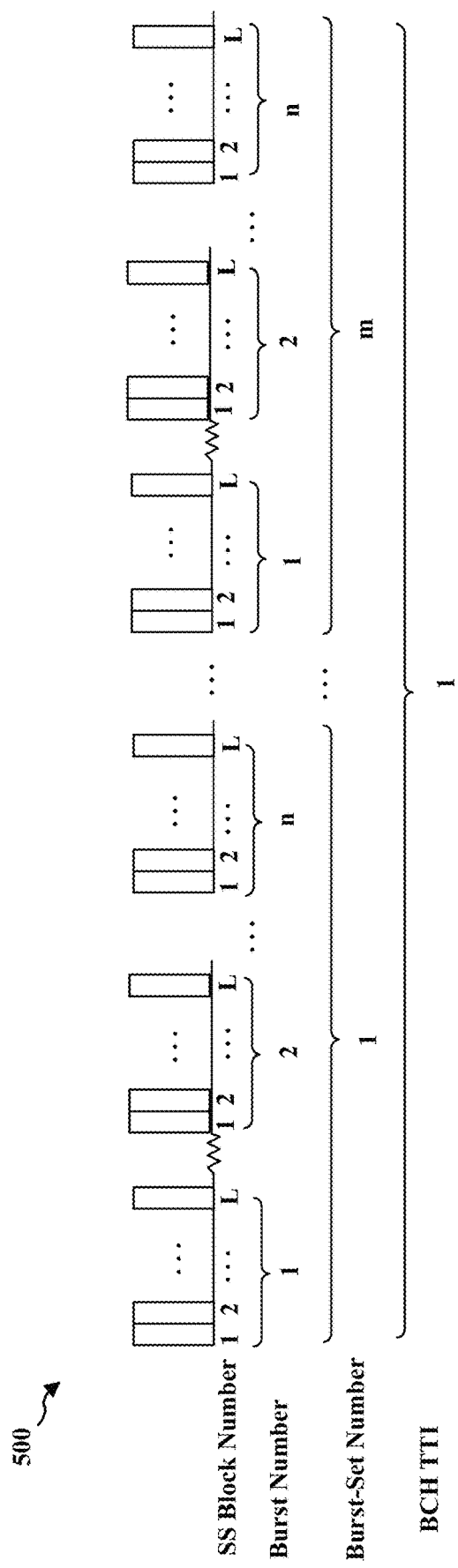
FIG. 5 illustrates an example bust, burst-set, and BCH TTI for PBCH transmissions.

FIG. 5 illustrates an example configuration 500 of a burst, burst-set, and BCH TTI for a PBCH transmission by a base station. In FIG. 5, a number (L) SS blocks are illustrated per burst, a number (n) bursts are illustrated per burst-set, and a number (m) burst-sets are illustrated per BCH TTI. A burst-set may be, e.g., a set of SS blocks comprising one complete beam sweep. Thus, the periodicity of the burst-set may be the periodicity at which the UE receives SS blocks on the same gNB beam. The SS blocks might not be contiguous, e.g., permitting interspersed downlink (DL) and uplink (UL) control and data. For example, a burst-set may comprise multiple bursts, where a burst comprises a set of consecutive SS block transmission resources available to the gNB.

At least part of the residual timing information for the synchronization signals may be explicitly in a PBCH payload. For example, the PBCH payload may include an SS block index and/or an SS burst-set index. A UE may combine PBCH transmissions for decoding to improve PBCH decoding performance. At times, the PBCH transmissions may possibly carry different SS block indices. The UE may use the SS block indices to combine PBCH from different SS blocks by hypothesizing on bit differences between the payloads of any two PBCH receptions, where the bit differences arise from different SS block and burst-set indices for the two PBCHs.

Based on the linearity of a code $G(b+\delta)=Gb+G\delta$, where G denotes a tall generating matrix, and b and $\delta$ denote (column) vector, all in GF(2), PBCH may be combined across two SS blocks based on a hypothesizing bit-differences $\delta$ between the respective payloads of the two SS blocks.

Let $l \in \mathcal{L} \equiv \{0, \ldots, l_{max}-1\}$ denote SS block index, where $l_{max}$ is the total number of SS blocks and $\mathcal{L}$ represents the set of SS block indices. In one example, $l_{max}$ may equal 64. This is only one example, and the aspects presented herein apply to different total numbers of SS blocks.

The functions $c(l)=Gb(l)$ may denote the codeword contained in a PBCH transmitted in SS block index l, where b(l) is the PBCH payload sent in SS block index l and contains l (e.g., 6 least significant bits (LSBs)), and $G=G_{polar}G_{CRC}$ is the systematic CRC generator matrix followed by a Polar code generating matrix. This $G_{polar}$ can be replaced with the generating matrix of any linear code and the aspects presented herein still apply. Similarly, $G_{CRC}$ can be replaced with the generating matrix of any linear error detection code and the aspects presented herein still apply.

The bit difference between the PBCH sent in SS block index $l_1$ and index $l_2$, respectively, may be represented by $\delta(\{l_1,l_2\})=b(l_1)+b(l_2)$, where $B \equiv \{\delta(\{l_1,l_2\}): \{l_1,l_2\} \subset \mathcal{L}\}$. As a note, $|B|=l_{max}$ (e.g., 64 in the example), even though there are $$\binom{l_{max}}{2}$$

hypotheses $\{l_1,l_2\}$.

When the UE detects the two SS blocks at a time distance of $\Delta t$ apart, the UE can combine PBCH in these two blocks. The time distance $\Delta t$ may be in units of SS blocks. For example, $$c(l+\Delta t) = Gb(l+\Delta t) = G \cdot [b(l) + \delta(\{l, l+\Delta t\})]$$
$$= Gb(l) + G\delta(\{l, l+\Delta t\})$$
$$= c(l) + G\delta(\{l, l+\Delta t\})$$
$$\Rightarrow c(l) = c(l+\Delta t) + G\delta(\{l, l+\Delta t\})$$

Thus, the codewords sent in PBCH in SS blocks l and l+$\Delta t$ are related, and the UE may derive one codeword from the other when the time separation $\Delta t$ is known. In other words, one codeword can be seen as a scrambled version of the other codeword, where scrambling is given by $G\delta(\{l,l+\Delta t\})$. In this example, the UE already knows $\Delta t$ (i.e., how far apart in time it detected the two SS blocks). Hence, the UE can combine decoding metrics, such as LLRs, computed for the two receptions and thus improve decoding performance. In order to derive one PBCH codeword from the other, for all hypotheses $l \in \mathcal{L}$ such that $(l+\Delta t) \in \mathcal{L}$, the UE may compute the following:

Compute $b_\delta(\{l,l+\Delta t\})$, (1)

Compute $G \cdot \delta(\{l,l+\Delta t\})$, (2)

In one example, this can be computed and stored offline since possible values for bit difference vector $\delta(\{l,l+\Delta t\})$ may be small (e.g., $l_{max}$).

After performing the two computations, the UE may add log likelihood ratios (LLRs) by correcting a sign of LLRs (l+$\Delta t$) using $G \cdot \delta(\{l,l+\Delta t\})$.

Then, the UE may decode the PBCHs and check CRC. The UE may determine the SS block index for the PBCHs from the decoded information.

Figure 6A:
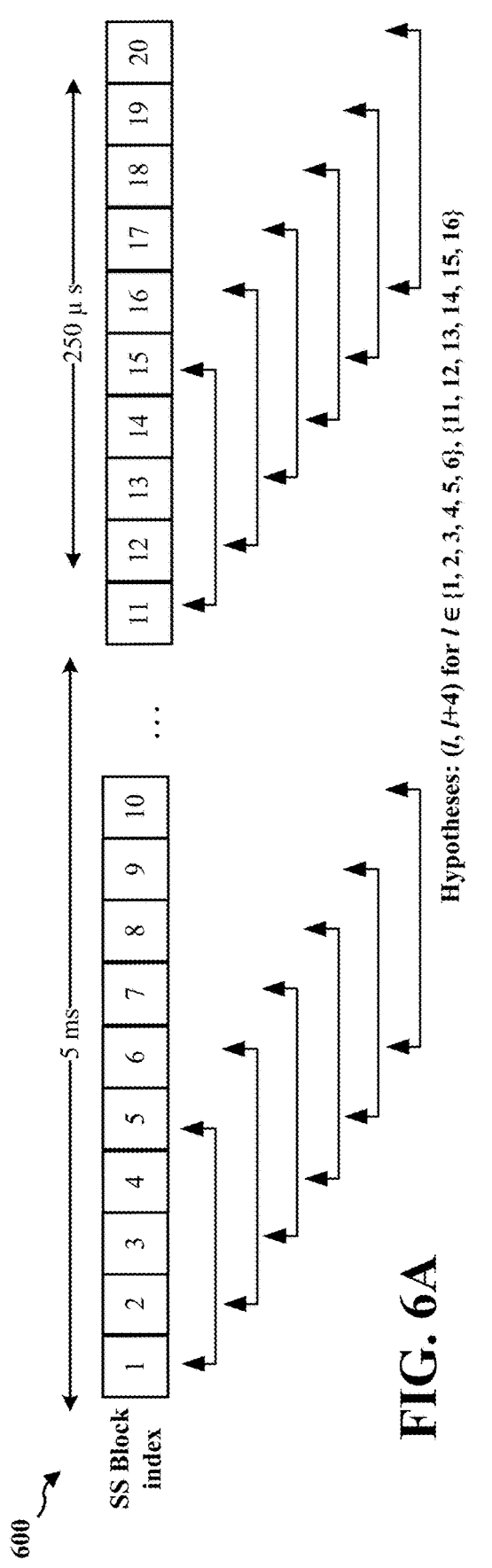
FIGS. 6A and 6B illustrate example SS Block index structures and corresponding example hypotheses for pair sets.

The set of hypotheses may comprise all hypotheses $l \in L$ such that $(l+\Delta t) \in L$. The set of hypotheses depends on an SS block pattern configuration (e.g., SS Burst and/or Burst-set design) of the communication system. $L \equiv \{0, \ldots, l\_max-1\}$ denotes the set of SS block indices, where lmax is the total number of SS blocks in a burst-set. When the UE detects two SS blocks time $\Delta t$ apart, the set of hypotheses, e.g., all hypotheses $l \in L$ such that $(l+\Delta t) \in L$, depends on the burst-set pattern (i.e., the relative transmission times of the SS blocks) used in the system. FIG. 6A illustrates an example SS block structure 600 and illustrates the hypotheses (l,l+$\Delta t$) that the UE may evaluate for combining PBCHs if it detects two SS blocks $\Delta t$=4 SS-Block-durations apart. In FIG. 6A, l may be SS block index 1, 2, 3, 4, 5, or 6, but SS block indexes 7, 8, 9, and 10 do not allow for an SS block spaced at $\Delta t$=4 SS-Block-durations apart.

Figure 6B:
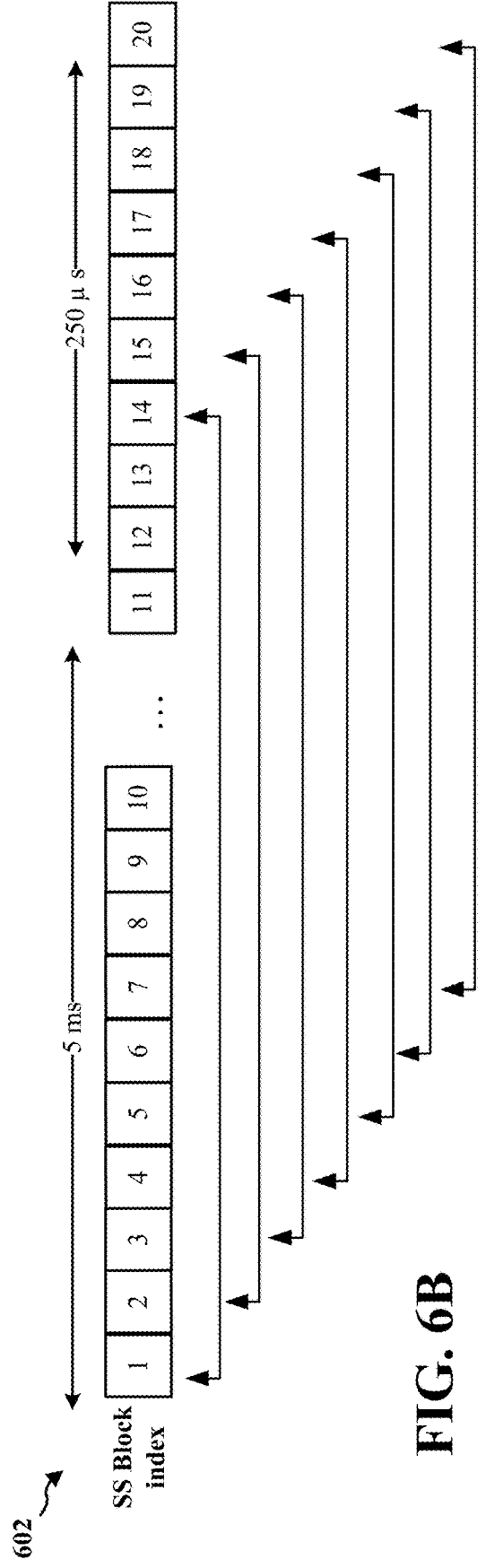

For a similar SS block pattern structure 602, FIG. 6B illustrates the hypotheses that a UE may evaluate for combining PBCHs if it detects two SS blocks at $\Delta t$=5 ms+(3 SS_Block_durations) apart.

Thus, timing information may be conveyed in a PBCH payload, e.g., an SS block index within a burst-set or within a BCH TTI. PBCHs from different SS blocks, carrying potentially different payloads due to timing information, can be combined for improved detection. The UE may hypothesize, based on the SS block index carried in each PBCH, where the hypotheses are commensurate with the time-gap between the receptions of the two SS blocks. For each hypothesis, the UE may compute the bit difference vector between the payloads for the hypothesis and compute the codeword corresponding to the bit difference vector. Finally, the UE may use this codeword to correctly combine the detection metrics (e.g., add LLRs with correct sign) from the two PBCHs, and decode the PBCH using the combined detection metrics.

A PBCH payload may include encoded bits that are already known to the UE, such as frozen bits. The PBCH payload may include encoded bits that are potentially known to the UE, and the UE may need to decode the PBCH for only a remaining set of unknown information.

The unknown information may include timing information, e.g., such as an SS block index, an SS burst-set index, a system frame number (SFN), and/or error detection bits. For example, the timing information may include CRC bits.

Thus, a part of the PBCH payload, or encoded PBCH bits, may already be known to the UE, and the UE may need to decode the PBCH for only the remaining, unknown information.

For example, a UE may potentially know most of the system information, e.g., MIB, for a neighbor cell PBCH, except for unknown timing information. This potentially known information may be known to the UE because it has been provided to the UE, e.g., a serving cell may provide such information regarding a neighbor cell to the UE. The PBCH may comprise frozen bits, which are also known by the UE. The UE may decode the partially known PBCH using at least part of the potentially known bits of the payload, as well as the frozen bits.

In one example, for a Polar coded PBCH, the potentially known payload may be treated as frozen bits in a decoding process at the UE.

For a given Polar code generator matrix $G_N$ of N×N, where $Q=(q_1, q_2, \ldots, q_N)$ is a bit location vector that provides the indices on input bits to the Polar encoder, $q_1$, $q_2, \ldots, q_N$ may be sorted based on an estimated reliability. For example, the input bits may be sorted such that $q_1$ is most reliable and so forth to $q_N$ being the least reliable. In some cases, reliability may be based on an estimate.

For example, for a simple generator matrix $$G_2 = \begin{bmatrix} 1 & 1 \\ 0 & 1 \end{bmatrix}$$

generator codeword $y=G_2 x$ for two-bit (column) vector x, we have Q=(2,1).

So, for a given $G_N$, we have a bit location vector Q. The, at the input of the encoder, K<N information bits are placed at the most reliable bit locations, and frozen bits (which are known bits) are the remaining N−K bit locations. The bit vector thus obtained is N×1 vector x. The encoder then produces an N bit codeword $y=G_N x$. At times, the transmitted codeword may be punctured to obtain fewer than N bits to transmit. In this case, bit location vector Q may be appropriately updated to reflect bit reliability based on the actually transmitted bits.

The frozen bits may be placed at the most unreliable bit locations. At least part of the potentially known bits may be placed on less reliable bit locations than those of unknown bits. Thus, the potentially known bits may be placed on bit locations with lower reliability than the reliability of bit locations where unknown bits are placed, in constructing the PBCH for transmission by the base station.

Given the location of potentially known bits, the UE may decode the PBCH based on a successive decoding of information bits. Frozen bits are already known by the UE and may not need to be decoded. The UE may decode the potentially known bits first and, then, may decode at least part of the unknown bits subsequently.

This may enable the UE to decode the PBCH for a neighbor cell more efficiently. For example, a UE may require a four shot PBCH decoding to obtain timing information such as an SS block index comprised in the PBCH. If a UE knows at least a part of the remaining bits for the neighbor cell PBCH, e.g., the bits other than the SS block index, the UE may treat those bits as frozen bits. This may enable the UE to obtain the SS block index with reduced decoding processing, e.g., with a single shot PBCH decoding.

Figure 7:
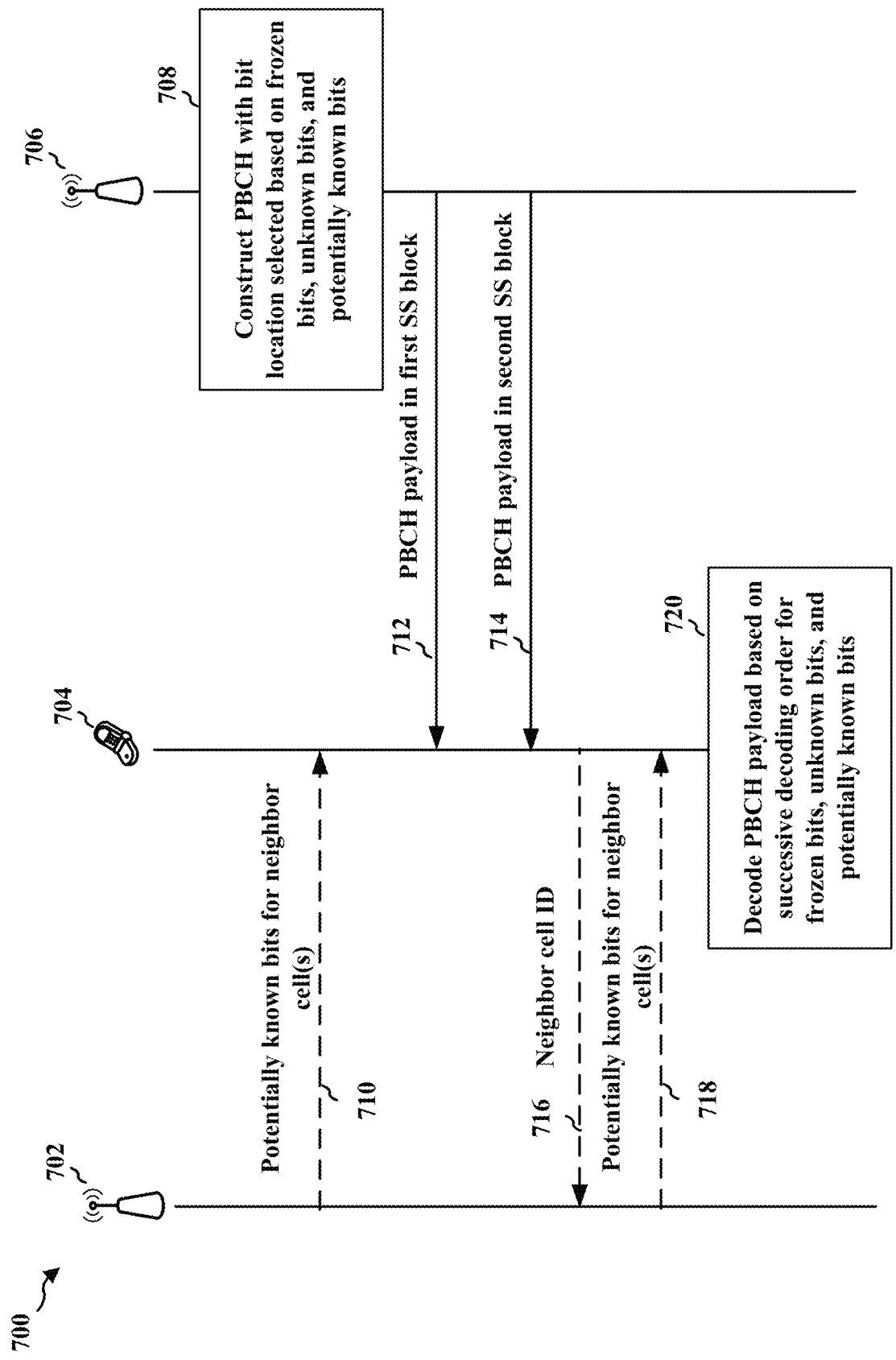
FIG. 7 illustrates an example of wireless communication between a UE and base stations.

FIG. 7 illustrates a communication flow 700 between a UE 704 (e.g., UE 104, 350, 404, 950, the apparatus 1202, 1202'), a first base station 702 (e.g., base station 180, 350), and a second base station 706 (e.g., base station 180, 350, 402, 1250 the apparatus 902, 902'), in accordance with aspects presented herein. The first base station 702 may be a serving base station, and the second base station may be a neighbor base station. The second base station 706 may transmit PBCH in a plurality of SS blocks. Each SS block may comprise timing information included in the PBCH payload, such as an SS block index. For example, FIG. 7 illustrates the base station 706 transmitting a first PBCH payload comprising first timing information in a first SS block 712 and a second PBCH payload comprising second timing information in a second SS block 714.

Figure 14:
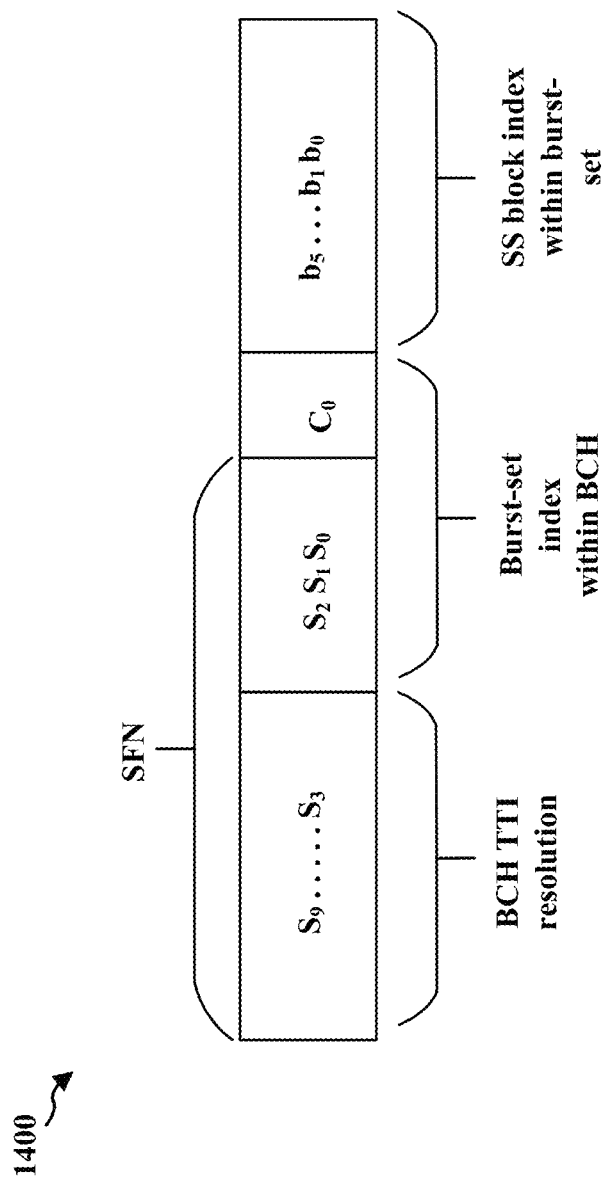
FIG. 14 illustrates an example of timing information to be carried in SS blocks.

FIG. 14 illustrates an example of total timing information 1400 to be carried in SS blocks. FIG. 14 illustrates various portions of the timing bits indicating timing at different resolutions. At least some of these timing bits may be included in the PBCH payload sequence to be encoded, e.g., polar encoded.

At 708, the base station 706 may construct the PBCH at 708 selecting bit locations for PBCH information based on an estimated reliability for the corresponding bit location. As certain PBCH fields may have known bit values in certain scenarios, the PBCH fields may be placed, e.g., in more reliable or less reliable bit locations, to improve PBCH decoder performance. For example, frozen bits may be placed at the most unreliable bit locations, and at least part of the potentially known bits may be placed at less reliable bit locations than unknown bits. As described in connection with FIGS. 5, 6, and 8, PBCH fields may include SS block time indexes, reserved and system information bits, SFN bits, etc.

The UE 704 may decode the PBCH payload received from the base station 706 based on a successive decoding order at 720. Frozen bits may already be known and may not require decoding. The UE may first decode potentially known bits and subsequently decode the unknown bits.

As illustrated in FIG. 7, the potentially known bits may correspond to information regarding the second base station PBCH that is provided to the UE 704 from the first base station 702.

In a first example, a first cell may provide information regarding the second cell PBCH bits at 710 to the UE 704 prior to the UE reporting cell quality measurements for the second cell. For example, the UE 704 may receive the information regarding the second base station PBCH from the first base station 702 prior to receiving the PBCH from the second base station 706. The UE 704 may then detect the SS blocks of the second base station and may use the information 710 received from the first base station 702 to decode the second base station's PBCH using the successive decoding order at 720. This may reduce PBCH decoding latency.

In this first example, a serving cell may provide information regarding PBCH bits of a plurality of surrounding neighbor cells for each served UE to use in reporting neighbor cell qualities. For example, the serving cell may provide information corresponding to a plurality of neighbor cell identifiers (IDs). However, this may require the serving cell to provide a substantial amount of information to the UEs.

In a second example, the UE 704 may detect the SS blocks from the second base station 706 prior to receiving the information from the first base station 702. The UE may detect the cell ID of the second base station 706. Upon detecting the cell ID, the UE may report the cell ID to the first base station 702 at 716. In response to receiving the cell ID from the UE, the first base station 702 may provide the PBCH bit information for the second base station 706 to the UE at 718. The UE may then use the information from the first cell 702 to decode the second base station's PBCH using the successive decoding order at 720.

In this second example, a serving cell may provide information regarding PBCH bits for a specific neighbor cell in response to a UE reporting the corresponding cell ID. While this may involve more latency than the first example, the second example reduces the RRC signaling overhead for the serving base station.

Thus, a first base station may provide information to assist the UE in deriving the reference time of a second base station, e.g., a serving cell may assist the UE in deriving the reference time of a target cell.

Figure 8:
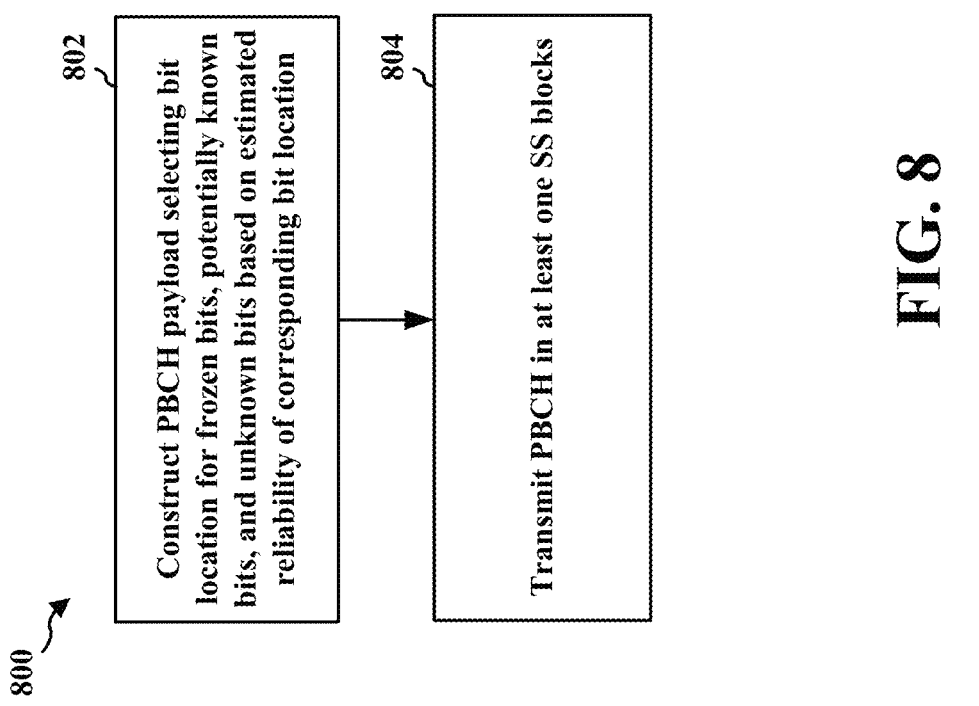
FIG. 8 is a flowchart of a method of wireless communication.

FIG. 8 is a flowchart 800 of a method of wireless communication. The method may be performed by a base station (e.g., the base station 102, 180, 310, 402, 706, 1250, the apparatus 902, 902') communicating with a UE (e.g., UE 104, 350, 404, 704, 950, the apparatus 1202, 1202'). At 802, the base station constructs a PBCH payload, wherein bit locations are selected for encoding a plurality of bits of the PBCH based on estimated reliability of the bit locations wherein the plurality of bits comprise frozen bits, unknown bits that are unknown to a user equipment, and potentially known bits that are potentially known by the user equipment, e.g., as described in connection with 708 in FIG. 7. The PBCH payload may comprise a polar coded PBCH. At least a part of the potentially known bits may be given a less reliable bit location than the unknown bits in encoding the PBCH payload. The frozen bits may be given a less reliable bit location than the potentially known bits in encoding the PBCH payload. Thus, the base station may generate a PBCH sequence and may polar encode the PBCH sequence in a specific order to enable potentially improved PBCH decoder performance.

At 804, the base station transmits the PBCH payload in at least one of a plurality of SS blocks. In one example, each SS block comprises corresponding timing information. For example, as described in connection with FIGS. 5 and 6, each SS block may comprise an SS block index. Thus, the timing information may comprise at least one of an SS block index, an SS burst-set index, and a system frame number (SFN).

In one example, the unknown bits may comprise the timing information, e.g., at least one of an SS block index, an SS burst-set index, and an SFN. In other examples, the unknown bits may comprise other information. The unknown bits may include error detection bits, e.g., CRC bits or other information. For example, with network synchronization, the timing information that a UE receives from its serving cell may be applicable to a neighbor cell. Thus, in this example, information other than timing information may be comprised in the unknown bits.

The potentially known bits may comprise system information provided to the user equipment by a different cell. For example, such potentially known information may include any of numerology such as subcarrier spacing for other channels, a configuration of a common control resource set (CORESET), a configuration of transmission of remaining system information, system bandwidth, location of synchronization signals within the system bandwidth, and/or reserved bits. The potentially known information may include a part of a SFN, e.g., 8 MSBs out of a total of 10 bits of SFN. Thus, while the first cell might not be able to provide an exact timing of the second cell, the first cell may be able to provide a neighbor cell time within a certain level of precision, e.g., up to 20 ms precision.

Figure 9:
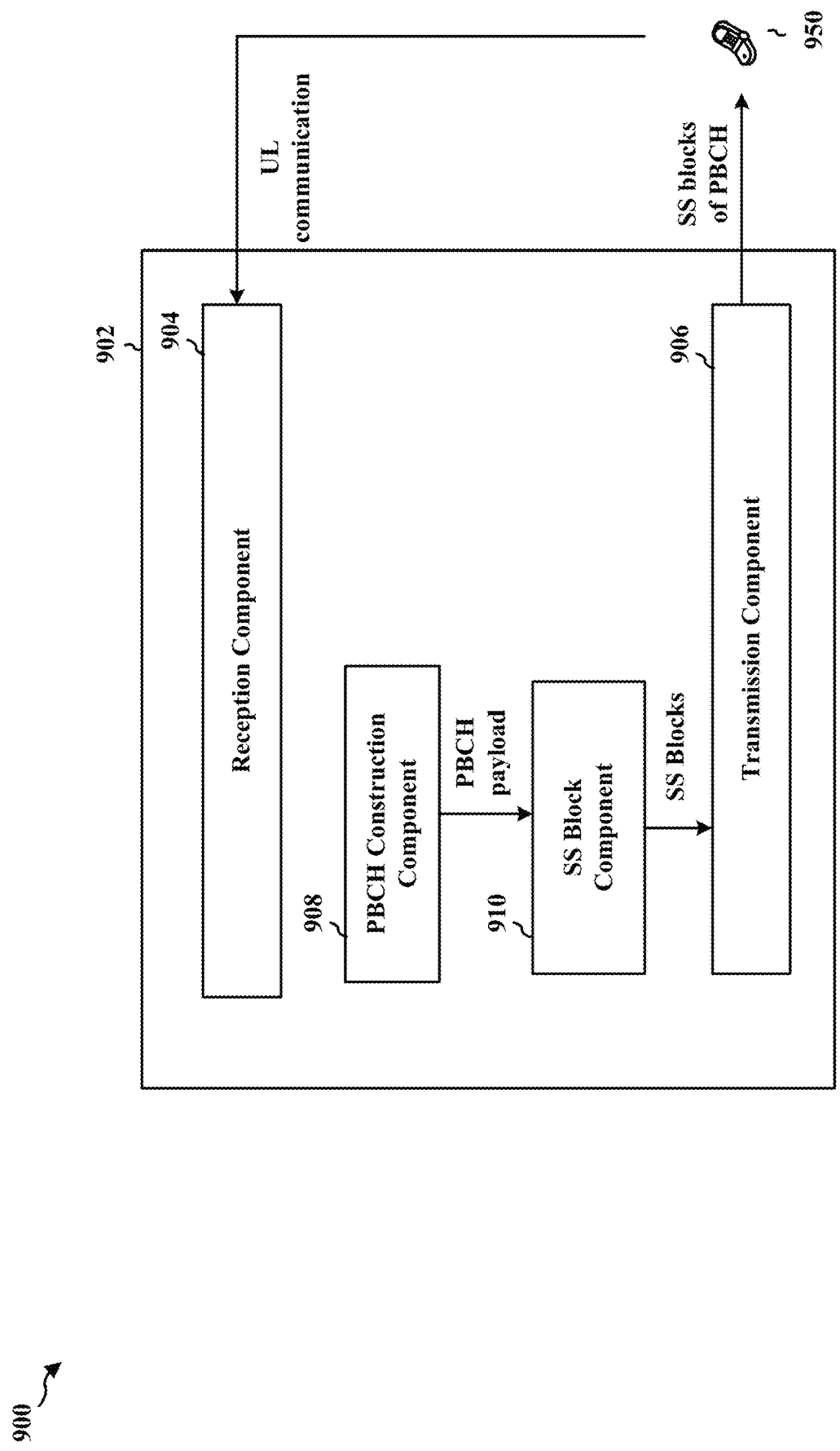
FIG. 9 is a conceptual data flow diagram illustrating the data flow between different means/components in an exemplary apparatus.

FIG. 9 is a conceptual data flow diagram 900 illustrating the data flow between different means/components in an exemplary apparatus 902. The apparatus may be a base station (e.g., base station 180, 310, 402, 706, 1250) communicating with UE 950 (e.g., UE 104, 350, 404, 704, the apparatus 1202, 1202'). The apparatus includes a reception component 904 that receives uplink communication, and a transmission component 906 that transmits DL communication to UEs, including PBCH. The apparatus may include a PBCH construction component 908 configured to construct a PBCH payload, wherein bit locations are selected for encoding a plurality of bits of the PBCH based on estimated reliability of the bit locations wherein the plurality of bits comprise frozen bits, unknown bits that are unknown to a user equipment, and potentially known bits that are potentially known by the user equipment. For example, the PBCH construction component may give at least a part of potentially known bits a less reliable bit location than unknown bits and may give frozen bits a less reliable bit location than potentially known bits when encoding the PBCH. The apparatus may include an SS block component 910 that is configured to transmit the PBCH payload, e.g., via transmission component 906, in at least one of a plurality of SS blocks.

The apparatus may include additional components that perform each of the blocks of the algorithm in the aforementioned flowcharts of FIGS. 7 and 8. As such, each block in the aforementioned flowcharts of FIGS. 7 and 8 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 10:
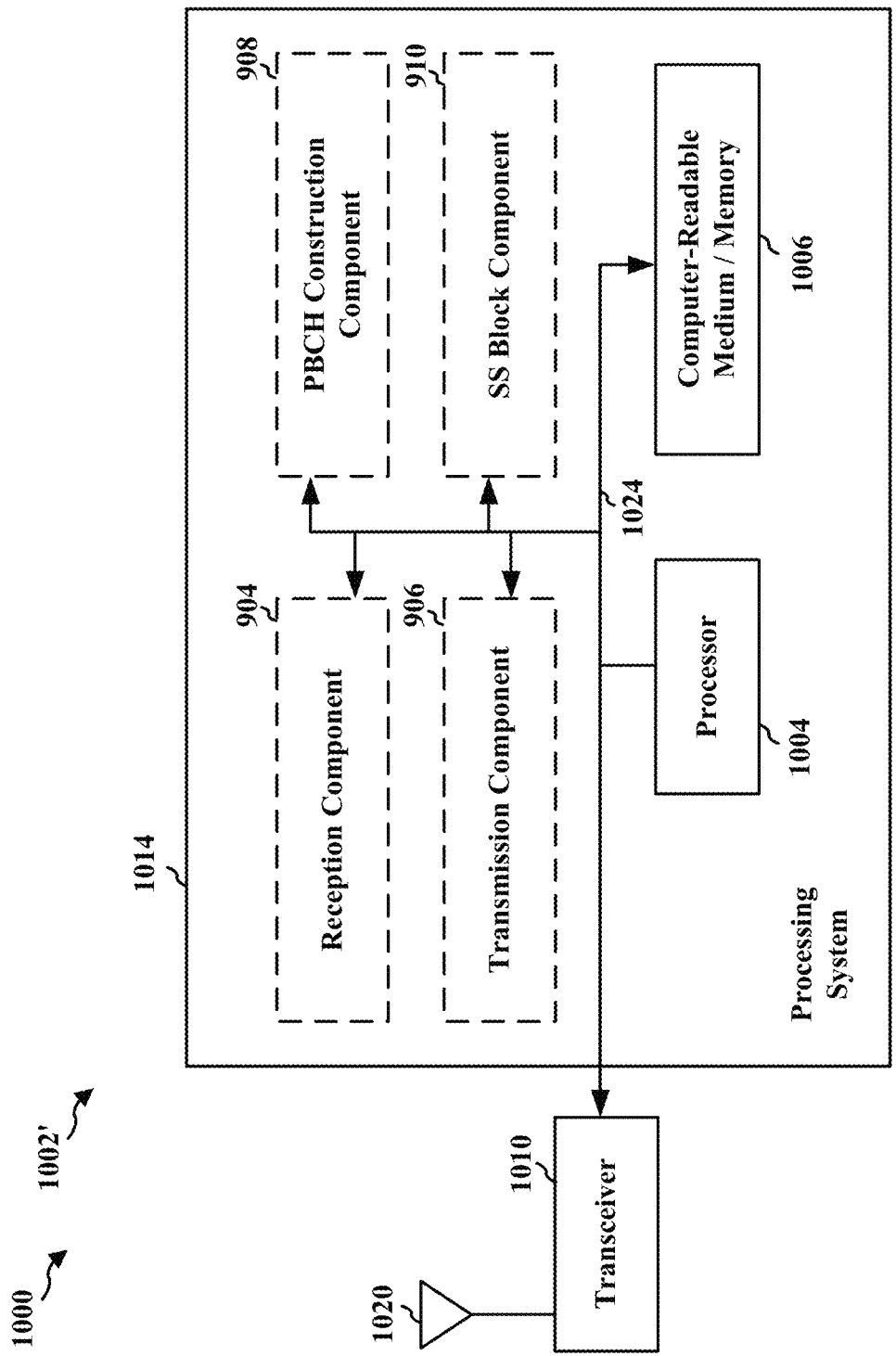
FIG. 10 is a diagram illustrating an example of a hardware implementation for an apparatus employing a processing system.

FIG. 10 is a diagram 1000 illustrating an example of a hardware implementation for an apparatus 902' employing a processing system 1014. The processing system 1014 may be implemented with a bus architecture, represented generally by the bus 1024. The bus 1024 may include any number of interconnecting buses and bridges depending on the specific application of the processing system 1014 and the overall design constraints. The bus 1024 links together various circuits including one or more processors and/or hardware components, represented by the processor 1004, the components 904, 906, 908, 910, and the computer-readable medium/memory 1006. The bus 1024 may also link various other circuits such as timing sources, peripherals, voltage regulators, and power management circuits, which are well known in the art, and therefore, will not be described any further.

The processing system 1014 may be coupled to a transceiver 1010. The transceiver 1010 is coupled to one or more antennas 1020. The transceiver 1010 provides a means for communicating with various other apparatus over a transmission medium. The transceiver 1010 receives a signal from the one or more antennas 1020, extracts information from the received signal, and provides the extracted information to the processing system 1014, specifically the reception component 904. In addition, the transceiver 1010 receives information from the processing system 1014, specifically the transmission component 906, and based on the received information, generates a signal to be applied to the one or more antennas 1020. The processing system 1014 includes a processor 1004 coupled to a computer-readable medium/memory 1006. The processor 1004 is responsible for general processing, including the execution of software stored on the computer-readable medium/memory 1006. The software, when executed by the processor 1004, causes the processing system 1014 to perform the various functions described supra for any particular apparatus. The computer-readable medium/memory 1006 may also be used for storing data that is manipulated by the processor 1004 when executing software. The processing system 1014 further includes at least one of the components 904, 906, 908, 910. The components may be software components running in the processor 1004, resident/stored in the computer readable medium/memory 1006, one or more hardware components coupled to the processor 1004, or some combination thereof. The processing system 1014 may be a component of the base station 310 and may include the memory 376 and/or at least one of the TX processor 316, the RX processor 370, and the controller/processor 375.

In one configuration, the apparatus 902/902' for wireless communication includes means for constructing a PBCH payload, wherein a bit location is selected for encoding a plurality of bits of the PBCH based on an estimated reliability for the corresponding bits location wherein the plurality of bits comprises frozen bits, unknown bits that are unknown to a user equipment, and potentially known bits that are potentially known by the user equipment, and means for transmitting the PBCH payload in at least one of a plurality of SS blocks, wherein each SS block comprises corresponding timing information. The aforementioned means may be one or more of the aforementioned components of the apparatus 902 and/or the processing system 1014 of the apparatus 902' configured to perform the functions recited by the aforementioned means. As described supra, the processing system 1014 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

Figure 11:
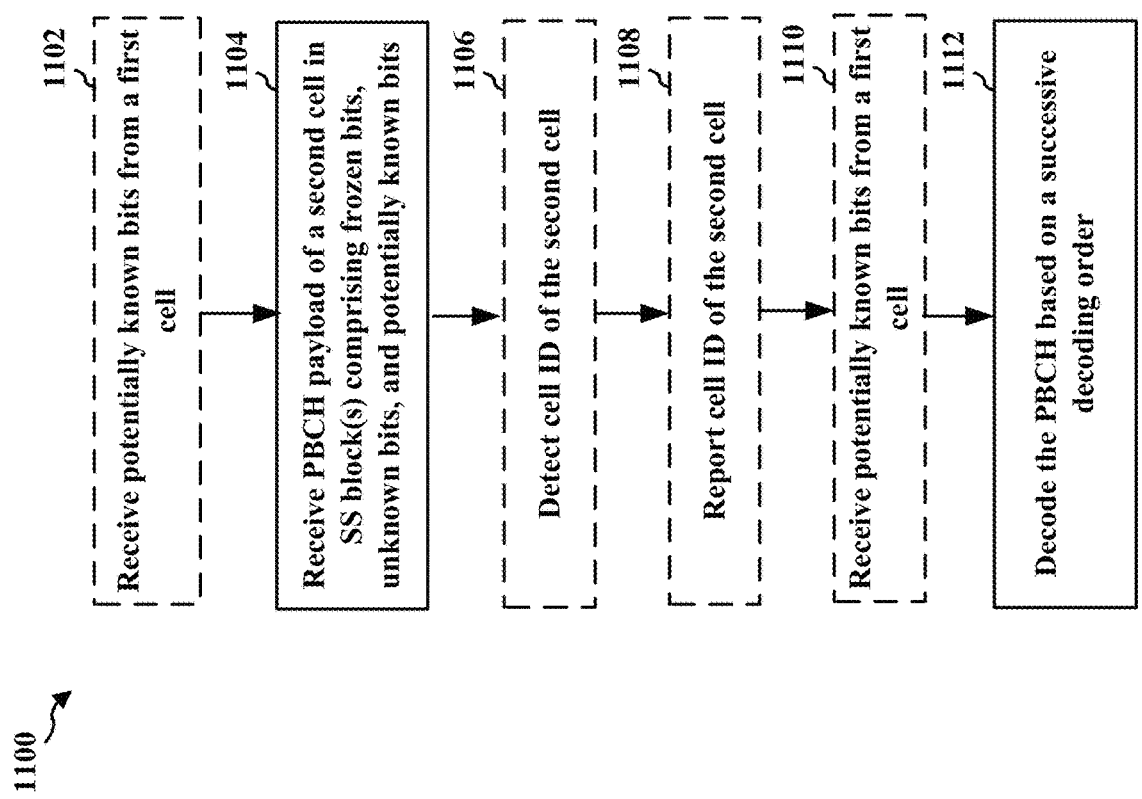
FIG. 11 is a flowchart of a method of wireless communication.

FIG. 11 is a flowchart 1100 of a method of wireless communication. The method may be performed by a UE (e.g., UE 104, 350, 404, 704, 950, the apparatus 1202, 1202') served by a first cell and receiving communication from a base station (e.g., the base station 102, 180, 310, 402, 706, 1250, the apparatus 902. 902') of a second cell. Optional aspects are illustrated with a dashed line. At 1104, the UE receives a PBCH payload of a second cell in at least one of a plurality of SS blocks, wherein each SS block comprises corresponding timing information, and wherein the PBCH payload comprises frozen bits, unknown bits that are unknown to the user equipment, and potentially known bits that are potentially known by the user equipment. The PBCH payload may comprise a polar coded PBCH.

At 1112, the UE decodes the PBCH based on a successive decoding order. The successive decoding order may be based on an estimated reliability for the corresponding bits. The potentially known bits may be decoded prior to the unknown bits. The potentially known bits may comprise system information provided to the user equipment by the first cell. The unknown bits may comprise the timing information, e.g., at least one of an SS block index, an SS burst-set index, and an SFN. The potentially known bits may comprise error detection bits, e.g., CRC bits.

In one example, as illustrated at 1102, the UE may receive, from the first cell, a plurality of potentially known bits corresponding to a cell ID for the second cell prior to reporting a cell quality. Then, at 1106, the UE may detect a cell ID of the second cell from a received SS block. The PBCH may be decoded based on the successive decoding order at 1112 using the bits obtained from the first cell.

In another example, the UE might not receive potentially known bits prior to receiving the PBCH at 1104. In this example, the UE may report the detected cell ID of the second cell to the first cell at 1108. Then, at 1110, the UE may receive, from the first cell, a plurality of potentially known bits corresponding to the cell ID for the second cell in response to the reporting the cell ID. The PBCH may be decoded based on the successive decoding order at 1112 using the bits obtained from the first cell.

Figure 12:
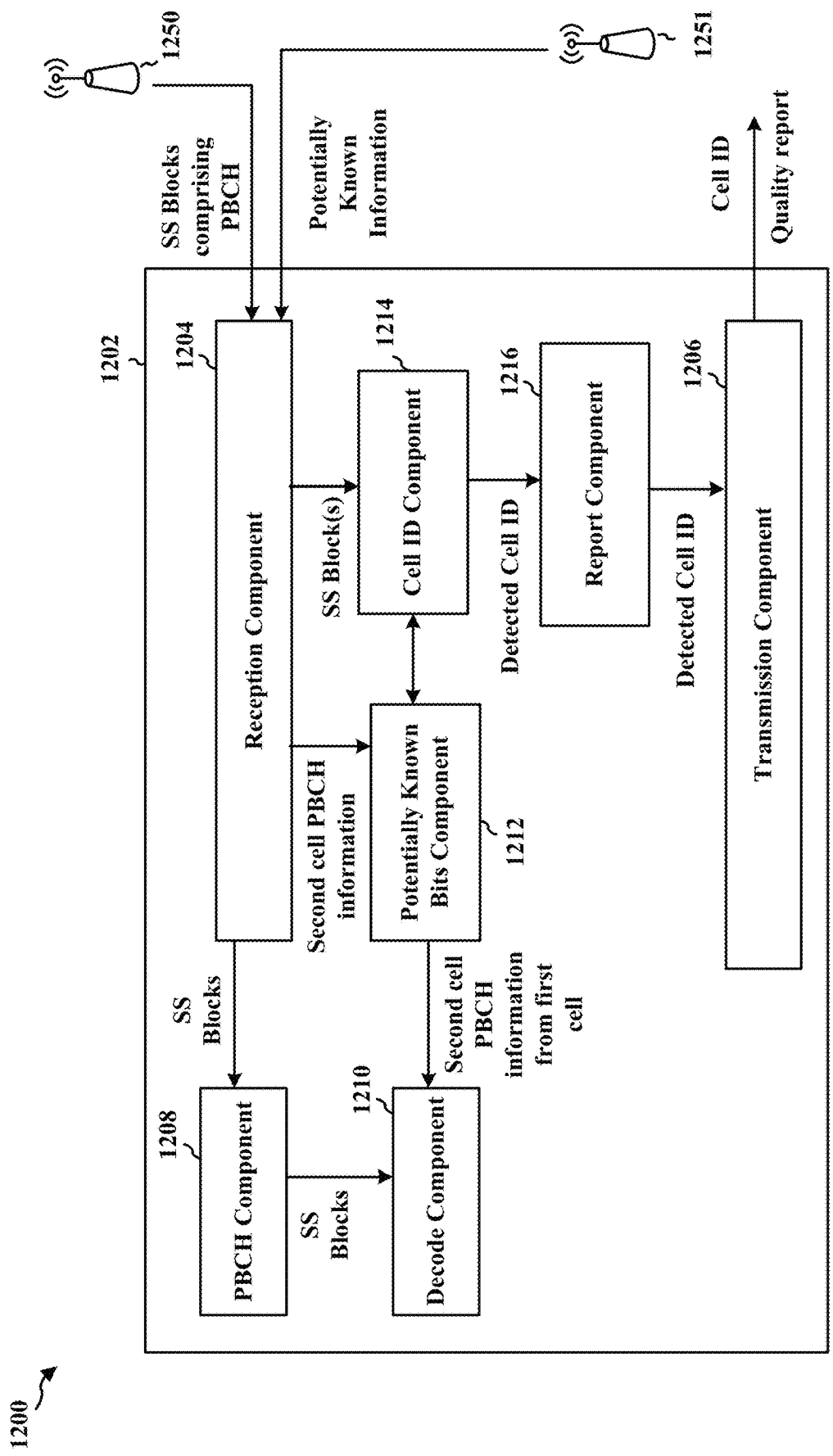
FIG. 12 is a conceptual data flow diagram illustrating the data flow between different means/components in an exemplary apparatus.

FIG. 12 is a conceptual data flow diagram 1200 illustrating the data flow between different means/components in an exemplary apparatus 1202. The apparatus may be a UE (e.g., UE 104, 350, 404, 704, 950) communicating with a first base station 1251 (e.g., base station 180, 310, 402, 702) and with second base station 1250 (e.g., base station 180, 310, 402, 706, the apparatus 902, 902'). The apparatus includes a reception component 1204 that receives downlink communication from a first cell and a second cell, e.g., via first base station 1251 and second base station 1250. The apparatus includes a transmission component 1206 that transmits UL communication to base stations, e.g., 1250, 1251. The apparatus includes a PBCH component 1208 configured to receives a PBCH payload of a second cell in at least one of a plurality of SS blocks, wherein each SS block comprises corresponding timing information, and wherein the PBCH payload comprises frozen bits, unknown bits that are unknown to the user equipment, and potentially known bits that are potentially known by the user equipment.

The apparatus includes a decode component 1210 configured to decode the PBCH based on a successive decoding order. The successive decoding order may be based on an estimated reliability for the corresponding bits.

The apparatus may include a potentially known bits component 1212 configured to receive, from the first cell, a plurality of potentially known bits corresponding to a cell ID for the second cell. The apparatus may include a cell ID component 1214 configured to detect a cell ID of the second cell 1250. The potentially known bits may be received prior to detecting the cell ID, and the cell ID may be used to identify the potentially known bits for the corresponding second cell. In another example, the UE may detect the cell ID prior to receiving the potentially known bits. The apparatus may further include a report component 1216 configured to report the cell ID of the second cell to the first cell. Then, the potentially known bits for the second cell may be received in response to the reported cell ID.

The apparatus may include additional components that perform each of the blocks of the algorithm in the aforementioned flowcharts of FIGS. 7 and 11. As such, each block in the aforementioned flowcharts of FIGS. 7 and 11 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 13:
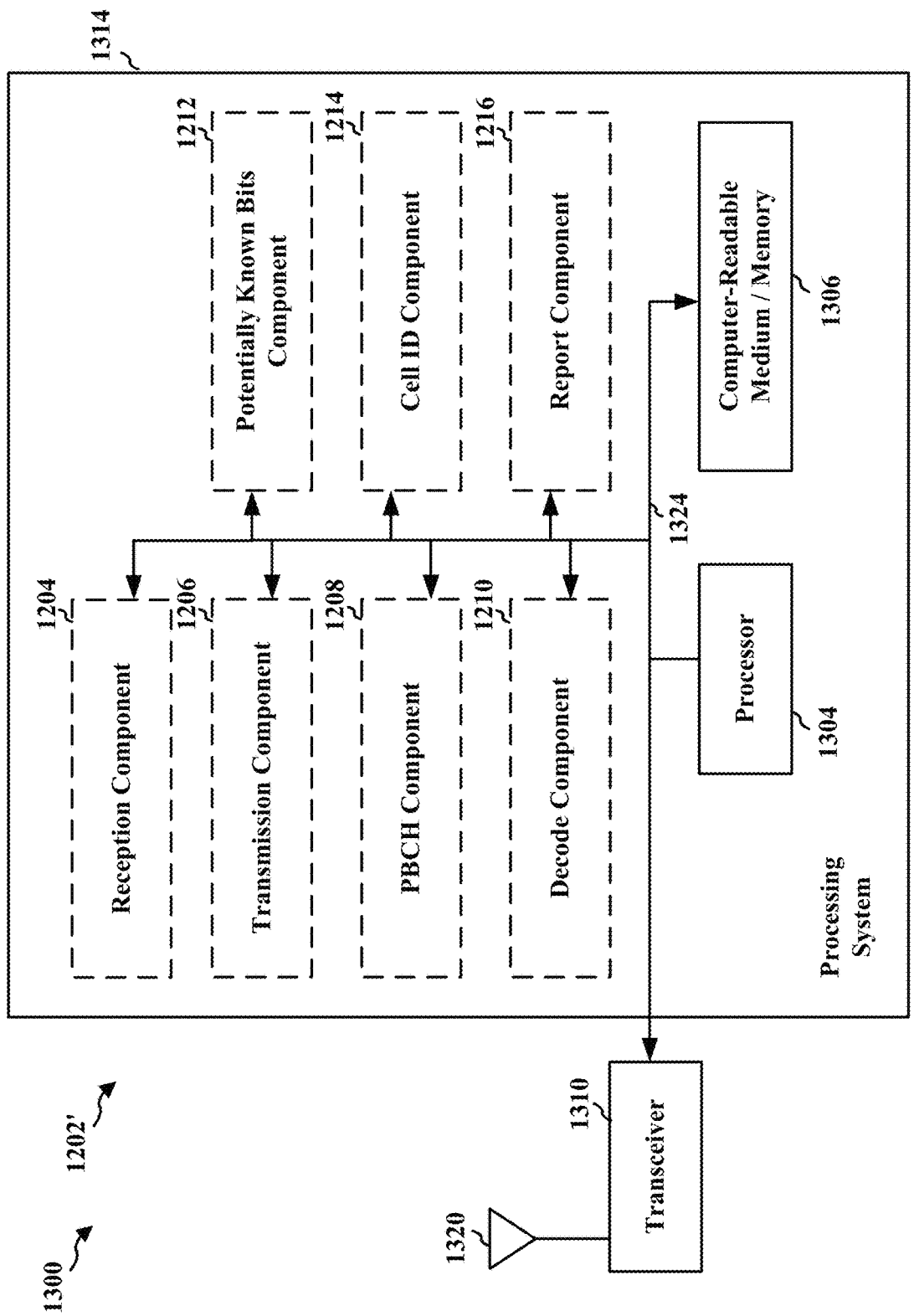
FIG. 13 is a diagram illustrating an example of a hardware implementation for an apparatus employing a processing system.

FIG. 13 is a diagram 1300 illustrating an example of a hardware implementation for an apparatus 1202' employing a processing system 1314. The processing system 1314 may be implemented with a bus architecture, represented generally by the bus 1324. The bus 1324 may include any number of interconnecting buses and bridges depending on the specific application of the processing system 1314 and the overall design constraints. The bus 1324 links together various circuits including one or more processors and/or hardware components, represented by the processor 1304, the components 1204, 1206, 1208, 1210, 1212, 1214, 1216, and the computer-readable medium/memory 1306. The bus 1324 may also link various other circuits such as timing sources, peripherals, voltage regulators, and power management circuits, which are well known in the art, and therefore, will not be described any further.

The processing system 1314 may be coupled to a transceiver 1310. The transceiver 1310 is coupled to one or more antennas 1320. The transceiver 1310 provides a means for communicating with various other apparatus over a transmission medium. The transceiver 1310 receives a signal from the one or more antennas 1320, extracts information from the received signal, and provides the extracted information to the processing system 1314, specifically the reception component 1204. In addition, the transceiver 1310 receives information from the processing system 1314, specifically the transmission component 1206, and based on the received information, generates a signal to be applied to the one or more antennas 1320. The processing system 1314 includes a processor 1304 coupled to a computer-readable medium/memory 1306. The processor 1304 is responsible for general processing, including the execution of software stored on the computer-readable medium/memory 1306. The software, when executed by the processor 1304, causes the processing system 1314 to perform the various functions described supra for any particular apparatus. The computer-readable medium/memory 1306 may also be used for storing data that is manipulated by the processor 1304 when executing software. The processing system 1314 further includes at least one of the components 1204, 1206, 1208, 1210, 1212, 1214, 1216. The components may be software components running in the processor 1304, resident/stored in the computer readable medium/memory 1306, one or more hardware components coupled to the processor 1304, or some combination thereof. The processing system 1314 may be a component of the UE 350 and may include the memory 360 and/or at least one of the TX processor 368, the RX processor 356, and the controller/processor 359.

In one configuration, the apparatus 1202/1202' for wireless communication includes means for receiving a PBCH payload of a second cell in at least one of a plurality of SS blocks, wherein each SS block comprises corresponding timing information, and wherein the PBCH payload comprises frozen bits, unknown bits that are unknown to the user equipment, and potentially known bits that are potentially known by the user equipment, means for decoding the PBCH based on a successive decoding order, means for receiving, from the first cell, a plurality of potentially known bits corresponding to a cell ID for the second cell prior to reporting a cell quality, means for detecting a cell ID of the second cell from a received SS block, means for reporting the cell ID of the second cell to the first cell, and means for receiving, from the first cell, a plurality of potentially known bits corresponding to the cell ID for the second cell in response to the reporting the cell ID. The aforementioned means may be one or more of the aforementioned components of the apparatus 1202 and/or the processing system 1314 of the apparatus 1202' configured to perform the functions recited by the aforementioned means. As described supra, the processing system 1314 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication at a user equipment (UE) served by a first cell, comprising:
    receiving a physical broadcast channel (PBCH) payload of a second cell in at least one of a plurality of synchronization signal (SS) blocks, wherein each SS block comprises corresponding timing information, and wherein the PBCH payload comprises frozen bits, unknown bits that are unknown to the UE, and potentially known bits that are potentially known by the UE, wherein the potentially known bits comprise at least a part of the timing information;
    receiving, from the first cell, a plurality of potentially known bits corresponding to a cell identifier (ID) for the second cell prior to reporting a cell quality;
    detecting the cell ID of the second cell from a received SS block; and
    decoding the PBCH payload based on a successive decoding order using the plurality of potentially known bits received from the first cell, wherein the potentially known bits are decoded prior to the unknown bits.

2. The method of claim 1, wherein the successive decoding order is based on an estimated reliability for corresponding bits.

3. The method of claim 1, wherein the potentially known bits further comprise system information provided to the UE by the first cell.

4. The method of claim 1, wherein the PBCH payload comprises a polar coded PBCH.

5. A method of wireless communication at a user equipment (UE) served by a first cell, comprising:
receiving a physical broadcast channel (PBCH) payload of a second cell in at least one of a plurality of synchronization signal (SS) blocks, wherein each SS block comprises corresponding timing information, and wherein the PBCH payload comprises frozen bits, unknown bits that are unknown to the UE, and potentially known bits that are potentially known by the UE, wherein the potentially known bits comprise at least a part of the timing information;
detecting a cell identifier (ID) of the second cell from a received SS block;
reporting the cell ID of the second cell to the first cell;
receiving, from the first cell, a plurality of potentially known bits corresponding to the cell ID for the second cell in response to the reporting the cell ID; and
decoding the PBCH payload based on a successive decoding order using the plurality of potentially known bits received from the first cell, wherein the potentially known bits are decoded prior to the unknown bits.

6. The method of claim 5, wherein the successive decoding order is based on an estimated reliability for corresponding bits.

7. The method of claim 5, wherein the potentially known bits further comprise system information provided to the UE by the first cell.

8. The method of claim 5, wherein the PBCH payload comprises a polar coded PBCH.

9. An apparatus for wireless communication at a user equipment (UE) served by a first cell, comprising:
means for receiving a physical broadcast channel (PBCH) payload of a second cell in at least one of a plurality of synchronization signal (SS) blocks, wherein each SS block comprises corresponding timing information, and wherein the PBCH payload comprises frozen bits, unknown bits that are unknown to the UE, and potentially known bits that are potentially known by the UE, wherein the potentially known bits comprise at least a part of the timing information;
means for receiving, from the first cell, a plurality of potentially known bits corresponding to a cell identifier (ID) for the second cell prior to reporting a cell quality;
means for detecting a cell ID of the second cell from a received SS block; and
means for decoding the PBCH payload based on a successive decoding order using the plurality of potentially known bits received from the first cell, wherein the potentially known bits are decoded prior to the unknown bits.

10. The apparatus of claim 9, wherein the successive decoding order is based on an estimated reliability for corresponding bits.

11. The apparatus of claim 9, wherein the potentially known bits further comprise system information provided to the UE by the first cell.

12. The apparatus of claim 9, wherein the PBCH payload comprises a polar coded PBCH.

13. An apparatus for wireless communication at a user equipment (UE) served by a first cell, comprising:
means for receiving a physical broadcast channel (PBCH) payload of a second cell in at least one of a plurality of synchronization signal (SS) blocks, wherein each SS block comprises corresponding timing information, and wherein the PBCH payload comprises frozen bits, unknown bits that are unknown to the UE, and potentially known bits that are potentially known by the UE, wherein the potentially known bits comprise at least a part of the timing information;
means for detecting a cell identifier (ID) of the second cell from a received SS block;
means for reporting the cell ID of the second cell to the first cell;
means for receiving, from the first cell, a plurality of potentially known bits corresponding to the cell ID for the second cell in response to the reporting the cell ID; and
means for decoding the PBCH payload based on a successive decoding order using the plurality of potentially known bits received from the first cell, wherein the potentially known bits are decoded prior to the unknown bits.

14. The apparatus of claim 13, wherein the successive decoding order is based on an estimated reliability for corresponding bits.

15. The apparatus of claim 13, wherein the potentially known bits further comprise system information provided to the UE by the first cell.

16. The apparatus of claim 13, wherein the PBCH payload comprises a polar coded PBCH.

17. An apparatus for wireless communication at a user equipment (UE) served by a first cell, comprising:
a memory; and
at least one processor coupled to the memory and configured to:
receive a physical broadcast channel (PBCH) payload of a second cell in at least one of a plurality of synchronization signal (SS) blocks, wherein each SS block comprises corresponding timing information, and wherein the PBCH payload comprises frozen bits, unknown bits that are unknown to the UE, and potentially known bits that are potentially known by the UE, wherein the potentially known bits comprise at least a part of the timing information;
receive, from the first cell, a plurality of potentially known bits corresponding to a cell identifier (ID) for the second cell prior to reporting a cell quality;
detect a cell ID of the second cell from a received SS block; and
decode the PBCH payload based on a successive decoding order using the plurality of potentially known bits received from the first cell, wherein the potentially known bits are decoded prior to the unknown bits.

18. The apparatus of claim 17, wherein the successive decoding order is based on an estimated reliability for corresponding bits.

19. The apparatus of claim 17, wherein the potentially known bits further comprise system information provided to the UE by the first cell.

20. The apparatus of claim 17, wherein the PBCH payload comprises a polar coded PBCH.

21. An apparatus for wireless communication at a user equipment (UE) served by a first cell, comprising:
a memory; and
at least one processor coupled to the memory and configured to:
receive a physical broadcast channel (PBCH) payload of a second cell in at least one of a plurality of synchronization signal (SS) blocks, wherein each SS block comprises corresponding timing information, and wherein the PBCH payload comprises frozen bits, unknown bits that are unknown to the UE, and potentially known bits that are potentially known by the UE, wherein the potentially known bits comprise at least a part of the timing information;
detect a cell identifier (ID) of the second cell from a received SS block;
report the cell ID of the second cell to the first cell;
receive, from the first cell, a plurality of potentially known bits corresponding to the cell ID for the second cell in response to the reporting the cell ID; and
decode the PBCH payload based on a successive decoding order using the plurality of potentially known bits received from the first cell, wherein the potentially known bits are decoded prior to the unknown bits.

22. The apparatus of claim 21, wherein the successive decoding order is based on an estimated reliability for corresponding bits.

23. The apparatus of claim 21, wherein the potentially known bits further comprise system information provided to the UE by the first cell.

24. The apparatus of claim 21 wherein the PBCH payload comprises a polar coded PBCH.

25. A non-transitory computer-readable medium storing computer executable code for wireless communication at a user equipment (UE) served by a first cell, comprising code to:
receive a physical broadcast channel (PBCH) payload of a second cell in at least one of a plurality of synchronization signal (SS) blocks, wherein each SS block comprises corresponding timing information, and wherein the PBCH payload comprises frozen bits, unknown bits that are unknown to the UE, and potentially known bits that are potentially known by the UE, wherein the potentially known bits comprise at least a part of the timing information;
receive, from the first cell, a plurality of potentially known bits corresponding to a cell identifier (ID) for the second cell prior to reporting a cell quality;
detect a cell ID of the second cell from a received SS block; and
decode the PBCH payload based on a successive decoding order using the plurality of potentially known bits received from the first cell, wherein the potentially known bits are decoded prior to the unknown bits.

26. The computer-readable medium of claim 25, wherein the successive decoding order is based on an estimated reliability for corresponding bits.

27. The computer-readable medium of claim 25, wherein the potentially known bits further comprise system information provided to the UE by the first cell.

28. The computer-readable medium of claim 25, wherein the PBCH payload comprises a polar coded PBCH.

29. A non-transitory computer-readable medium storing computer executable code for wireless communication at a user equipment (UE) served by a first cell, comprising code to:
receive a physical broadcast channel (PBCH) payload of a second cell in at least one of a plurality of synchronization signal (SS) blocks, wherein each SS block comprises corresponding timing information, and wherein the PBCH payload comprises frozen bits, unknown bits that are unknown to the UE, and potentially known bits that are potentially known by the UE, wherein the potentially known bits comprise at least a part of the timing information;
detect a cell identifier (ID) of the second cell from a received SS block;
report the cell ID of the second cell to the first cell;
receive, from the first cell, a plurality of potentially known bits corresponding to the cell ID for the second cell in response to the reporting the cell ID; and
decode the PBCH payload based on a successive decoding order using the plurality of potentially known bits received from the first cell, wherein the potentially known bits are decoded prior to the unknown bits.

30. The computer-readable medium of claim 29, wherein the successive decoding order is based on an estimated reliability for corresponding bits.

31. The computer-readable medium of claim 29, wherein the potentially known bits further comprise system information provided to the UE by the first cell.

32. The computer-readable medium of claim 29, wherein the PBCH payload comprises a polar coded PBCH.

* * * * *